United States Patent [19]

Bosselaers

[11] 4,119,925
[45] Oct. 10, 1978

[54] FREQUENCY SYNTHESIZER WITH FREQUENCY MODULATED OUTPUT

[75] Inventor: Robert Jan Bosselaers, Winchester, Mass.

[73] Assignee: RCA Corporation, New York, N.Y.

[21] Appl. No.: 797,400

[22] Filed: May 16, 1977

[51] Int. Cl.² .............................................. H03B 3/04
[52] U.S. Cl. .................................. 331/1 A; 331/17; 331/16; 332/19; 331/32
[58] Field of Search .................. 331/1, 17, 19, 16, 25, 331/177; 332/19; 307/271; 328/14

[56]  References Cited
U.S. PATENT DOCUMENTS 3,735,276  5/1973  Apolant ............................... 331/177
4,052,672  10/1977  Enderby et al. ....................... 332/19

Primary Examiner—John Kominski
Attorney, Agent, or Firm—H. Christoffersen; Samuel Cohen; Carl V. Olson

[57] ABSTRACT

A frequency synthesizer having a frequency-locked loop providing any digitally selected output frequency, and means to frequency modulate the selected output frequency at an audio rate. The frequency-locked loop includes a frequency-to-current converter coupled to the output of a voltage-controlled oscillator to provide a current, representing the actual frequency of the oscillator, which is compared with a current representing a desired output frequency. A resulting error signal controls the oscillator center frequency, which can be frequency modulated by an audio-frequency signal.

1 Claim, 1 Drawing Figure

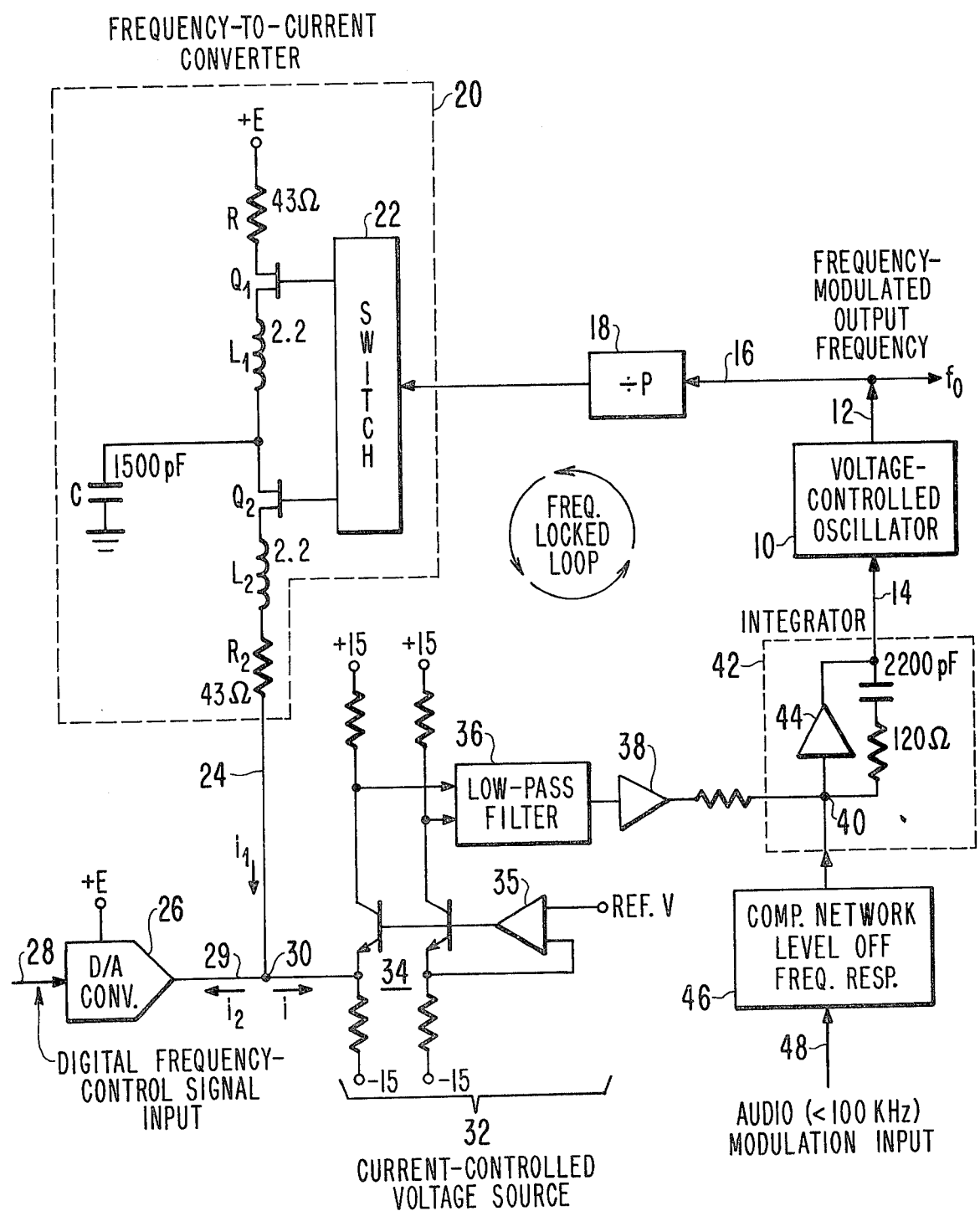

FREQUENCY SYNTHESIZER WITH FREQUENCY MODULATED OUTPUT

Frequency synthesizers are usually based on the direct approach in which frequencies are mixed, filtered and divided, or on the phase-locked loop approach in which the output of a voltage-controlled oscillator is variably divided down in frequency and compared in a phase detector with the output of a reference crystal oscillator. The output frequencies readily can be amplitude modulated, or phase modulated, by known techniques. However, when it is desired to frequency modulate the output frequency at an audio rate, it is necessary to replace the reference crystal oscillator and phase detector with a frequency-sensitive element such as a frequency discriminator based on a passive tuned circuit, or a frequency-to-voltage converter dependent on the time constant of an RC circuit. Known arrangements have been complicated and expensive, or incapable of providing an output center carrier frequency having a desired high accuracy and stability.

According to an embodiment or feature of the present invention, a simple and accurate frequency synthesizer is provided having a frequency-locked loop in which the frequency of the output of a voltage-controlled oscillator is converted to a corresponding signal which is compared with a signal representing a desired output frequency to produce a correction voltage applied to the control input of the oscillator. A frequency-modulating signal may also be applied to the control input of the voltage-controlled oscillator.

In the drawing:

The sole FIGURE of the drawing is a schematic diagram of a frequency synthesizer constructed according to the teachings of the invention.

The frequency synthesizer includes a voltage-controlled oscillator 10 having an output at 12 and having a control voltage input at 14. The oscillator 10 may be any suitable commercially-available unit. A portion of the output from the oscillator 10 is applied over path 16 to a frequency divider 18. In a frequency synthesizer actually constructed, the divider 18 was a Plessey Type SP622B divider followed by a National Semiconductor Type NS8291A frequency divider, together producing a frequency division by the number 80.

The output of the frequency divider 18 is applied to a frequency-to-current converter 20 including a switch 22, a field-effect transistor $Q_1$, and a field-effect transistor $Q_2$. The switch 22 and the transistors $Q_1$ and $Q_2$ may be constituted by a Siliconix Type DG187AA switch. The converter 20 includes a resistor R and a inductor $L_1$ in a path including the transistor $Q_1$ for charging a capacitor C from a $+E$ voltage source. The transistor $Q_2$ controls a path through which charge on capacitor C is discharged through an inductor $L_2$ and a resistor $R_2$ to a converter output line 24.

A digital-to-analog converter 26 has an input at 28 for a digital signal representing the frequency of a desired output signal from the voltage-controlled oscillator 10. The converter 26 produces a corresponding output current $i_2$ at 29 which is subtracted at a summation point 30 from the current $i_1$ on lead 24, and a resulting difference current $i$ is applied to the input of a current-controlled voltage source 32. The digital-to-analog converter 26 is supplied from a power supply (not shown) with $+E$ volts, and the frequency-to-current converter 20 is supplied from the same source with the same $+E$ volts. The result of that is that the accuracy with which the system produces a desired output frequency $f_0$ is not affected by changes in the power supply voltage $+E$.

The digital-to-analog converter 26 may, for example, be a Datel Type DAC MI-12B converter. The current-controlled voltage source 32 includes a matched dual transistor 34 and a low-offset operational amplifier 35 which keeps the emitter voltage of the reference half of transistor 34 at zero. The output voltage is free of drift except for very small amounts as may be caused by changes in resistor values. The source 32 converts the current $i$ at its input to a corresponding voltage output which is coupled through a low-pass filter 36 and an amplifier 38 to a junction point 40 at the input of an integrator 42. The filter 36 may be any suitable unit such as one providing a cut-off of frequencies above 159 KHz. The integrator 42 includes an operational amplifier 44 which may, for example, be an Analog Devices Type AD301AL operational amplifier. The output of the integrator 42 is applied to the frequency determining control voltage input line 14 of the voltage-controlled oscillator 10.

The junction point 40 at the input to the integrator 42 is also receptive to an audio-frequency modulating control voltage applied through a compensating network 46 from a source (not shown) over a line 48. The audio frequency signal is amplitude modulated at frequencies of less than 100 KHz, and the compensating network 46 insures that the audio signal has a flat amplitude response at all audio frequencies.

In operation of the frequency synthesizer, the voltage-controlled oscillator 10 normally produces an output frequency $f_0$, a portion of which is applied over line 16 and through the frequency divider 18 to the input of the frequency-to-current converter 20. The divided frequency applied to the switch 22 in the converter 20 operates the switch in such a way that sequentially in the course of one cycle, the transistor $Q_1$ is solely conductive, both transistors $Q_1$ and $Q_2$ are off, transistor $Q_2$ is solely conductive, and then both transistors are off. When transistor $Q_1$ is conductive, current from the voltage terminal $+E$ flows through the charging path including resistor R and inductor $L_1$ to the capacitor C. The capacitor is charged to the voltage E. When transistor $Q_2$ is conductive, the charge on the capacitor C is discharged through the path including inductor $L_2$ and resistor $R_2$. The resulting current $i_1$ in lead 24 averaged over many cycles is a current having am amplitude which varies in direct proportion with the frequency with which the switch 22 is operated. The current $i_1$ is then directly proportional to the existing output frequency $f_0$ from the voltage-controlled oscillator 10.

It is assumed that a digital number representing a different desired output frequency from the oscillator 10 is then applied to the digital-to-analog converter 26 at the digital multi-conductor input line 28. The converter 26 then produces an output current $i_2$ having an amplitude corresponding with the digital input number. A resulting current $i$ flows from the junction point 30 which represents the magnitude and the sense of the difference between the currents $i_1$ and $i_2$. The current $i$ is then a correction current having a value indicating the amount and direction in which the frequency of the oscillator 10 should be changed in order that the oscillator will produce an output signal having the desired frequency. The current-controlled voltage source 32 translates the current $i$ to a corresponding voltage which similarly represents the correction which should be applied to the oscillator 10. This voltage is applied through the low pass filter 36 and then the amplifier 38 to the junction point 40, and then through the integrator 42 to the control input 14 of the voltage controlled oscillator 10. The described frequency-locked loop thus operates to very rapidly change the output frequency of the oscillator 10 to the value selected by the digital input frequency to the D/A converter 26.

An audio frequency modulating signal on a line 48 may be applied through the compensating network 46 to the junction 40 at the input of the integrator 42. The modulating voltage thus introduced into the frequency-locked loop acts to modulate the output frequency of the oscillator 10 in accordance with the amplitude of the audio-frequency modulating voltage signal applied to the junction 40.

It is thus clear that the described frequency synthesizer is capable of being very rapidly switched from producing one output frequency to producing another desired output frequency determined by a digital command applied to the D/A converter 26, and that any center carrier frequency thus produced at the output of the oscillator 10 may be simply and conveniently frequency modulated in accordance with any desired audio input signal. The system is one having only a single loop. and having a high frequency stability which has been found to be better than 0.1 percent.

What is claimed is:

1. Means to generate an output signal having a desired center frequency, and to frequency modulate said output signal, comprising
   a voltage-controlled oscillator providing said output signal,
   a frequency divider coupled to the output of said oscillator,
   a frequency-to-current converter connected to the output of said frequency divider and producing an actual-frequency-representing current corresponding with the frequency of said output signal,
   a digital-to-analog converter converting an input digital signal representing a desired output signal frequency to a corresponding desired-frequency-representing current,
   means to produce an error current representing the difference between said actual-frequency-representing current and said desired-frequency-representing current,
   a current-controlled voltage source translating said error current to a corresponding error voltage,
   a low-pass filter, and an integrator, coupling said error voltage to the control voltage input of said voltage-controlled oscillator, to produce an output at the desired center frequency, and
   means to apply an audio-frequency modulating voltage also to the input of said integrator, to frequency modulate the output signal from said voltage-controlled oscillator.

* * * * *